United States Patent
Xiong et al.

(10) Patent No.: US 12,532,583 B2
(45) Date of Patent: *Jan. 20, 2026

(54) FLIP-CHIP LIGHT EMITTING DEVICE AND PRODUCTION METHOD THEREOF

(71) Applicant: Quanzhou Sanan Semiconductor Technology Co., Ltd., Nanan (CN)

(72) Inventors: Weiping Xiong, Xiqing District (CN); Xin Wang, Xiqing District (CN); Zhiwei Wu, Xiqing District (CN); Di Gao, Xiqing District (CN); Chun-I Wu, Xiqing District (CN); Duxiang Wang, Xiqing District (CN)

(73) Assignee: Quanzhou Sanan Semiconductor Technology Co., Ltd., Nanan (CN)

( * ) Notice: Subject to any disclaimer, the term of this patent is extended or adjusted under 35 U.S.C. 154(b) by 787 days.

This patent is subject to a terminal disclaimer.

(21) Appl. No.: 17/716,146

(22) Filed: Apr. 8, 2022

(65) Prior Publication Data

US 2022/0231197 A1    Jul. 21, 2022

Related U.S. Application Data

(63) Continuation-in-part of application No. 17/002,423, filed on Aug. 25, 2020, now Pat. No. 11,322,657.

(30) Foreign Application Priority Data

Aug. 29, 2019 (CN) .......................... 201910809304.5

(51) Int. Cl.
*H10H 20/84* (2025.01)
*H10H 20/82* (2025.01)

(52) U.S. Cl.
CPC ............ *H10H 20/84* (2025.01); *H10H 20/82* (2025.01)

(58) Field of Classification Search
None
See application file for complete search history.

(56) References Cited

U.S. PATENT DOCUMENTS

| | | | |
|---|---|---|---|
| 9,543,484 B1 | 1/2017 | Endo et al. | |
| 11,322,657 B2 * | 5/2022 | Xiong | ................ H01L 33/0066 |
| 2012/0193664 A1 * | 8/2012 | Lin | .......................... H01L 33/20 |
| | | | 257/E33.062 |
| 2013/0313596 A1 * | 11/2013 | Fu | .......................... H01L 33/22 |
| | | | 257/98 |
| 2014/0159090 A1 * | 6/2014 | Huang | .................... H01L 33/02 |
| | | | 257/98 |
| 2015/0076505 A1 * | 3/2015 | Ke | ........................ H10H 20/01 |
| | | | 438/29 |
| 2018/0337304 A1 * | 11/2018 | Fu | .......................... H01L 33/20 |

OTHER PUBLICATIONS

Search Report appended to an Office Action, which was issued to Chinese counterpart application No. 201910809304.5 by the CNIPA on Jun. 30, 2020 with an English translation thereof.

* cited by examiner

*Primary Examiner* — Su C Kim
(74) *Attorney, Agent, or Firm* — Thomas Horstemeyer, LLP

(57) ABSTRACT

A flip-chip light emitting device includes a substrate, a light-emitting layer, a bonding layer disposed between the substrate and the light-emitting layer, and a protective insulating layer disposed over the light-emitting layer and the bonding layer. The bonding layer has first and second upper surfaces that respectively have different first and second roughnesses.

17 Claims, 7 Drawing Sheets

FLIP-CHIP LIGHT EMITTING DEVICE AND PRODUCTION METHOD THEREOF

CROSS-REFERENCE TO RELATED APPLICATION

This application is a continuation-in-part application of U.S. patent application Ser. No. 17/002,423 filed on Aug. 25, 2020, which claims priority of Chinese Patent Application No. 201910809304.5, filed on Aug. 29, 2019. The content of each of the aforesaid prior applications is incorporated herein by reference in its entirety.

FIELD

The disclosure relates to a light emitting device and a production method thereof, and more particularly to a flip-chip light emitting device and a production method thereof.

BACKGROUND

Referring to FIG. 1, a conventional flip-chip light emitting device includes a transparent substrate 11, a transparent bonding layer 12, an epitaxial light-emitting structure, a first electrode 18, a second electrode 17, and a protective insulating layer 16. The light-emitting structure is connected with the transparent substrate 11 through the transparent bonding layer 12, and includes a first-type electrically conductive layer 13, an active layer 14, and an second-type electrically conductive layer 15 that are sequentially disposed on the transparent bonding layer 12 in such order. The active layer 14 is composed of quantum wells. The first and second electrodes 18, 17 are respectively disposed on the first-type and second-type electrically conductive layers 13, 15. The protective insulating layer 16 is disposed over the light-emitting structure and the bonding layer 12.

In order to enhance the light emission efficiency, a roughened interface 19 is formed between the first-type electrically conductive layer 13 and the transparent bonding layer 12, and between the protective insulating layer 16 and the transparent bonding layer 12. However, in one aspect, interstices exist at the part of the roughened interface 19 between the transparent bonding layer 12 and the protective insulating layer 16, such that liquids for processing the flip-chip light emitting device, water vapor, metal ions from solder, and so forth might undesirably pass through these interstices and hence lead to damages of the light-emitting structure. In another aspect, cracks might be generated in the protective insulating layer 6 during the cutting process of the flip-chip light emitting device. Thus, the protective insulating layer 6 might be undesirably detached due to the aforesaid drawbacks, leading to failure of the protective function of the protective insulating layer 6.

SUMMARY

Therefore, an object of the disclosure is to provide a flip-chip light emitting device that can alleviate at least one of the drawbacks of the prior art.

The flip-chip light emitting device includes a substrate, an epitaxial light-emitting layer, a bonding layer, and a protective insulating layer. The light-emitting layer has a top surface and a bottom surface that is opposite to the top surface and faces toward the substrate. The bonding layer is disposed between the substrate and the light-emitting layer. The protective insulating layer is disposed over the light-emitting layer and the bonding layer. The bonding layer has a first upper surface that faces away from the substrate and that the protective insulating layer is disposed thereon, and a second upper surface that faces away from the substrate, and that the light-emitting layer is disposed thereon. The first and second upper surfaces respectively have first and second roughnesses. The first roughness of the first upper surface is different from the second roughness of the second upper surface.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 7:
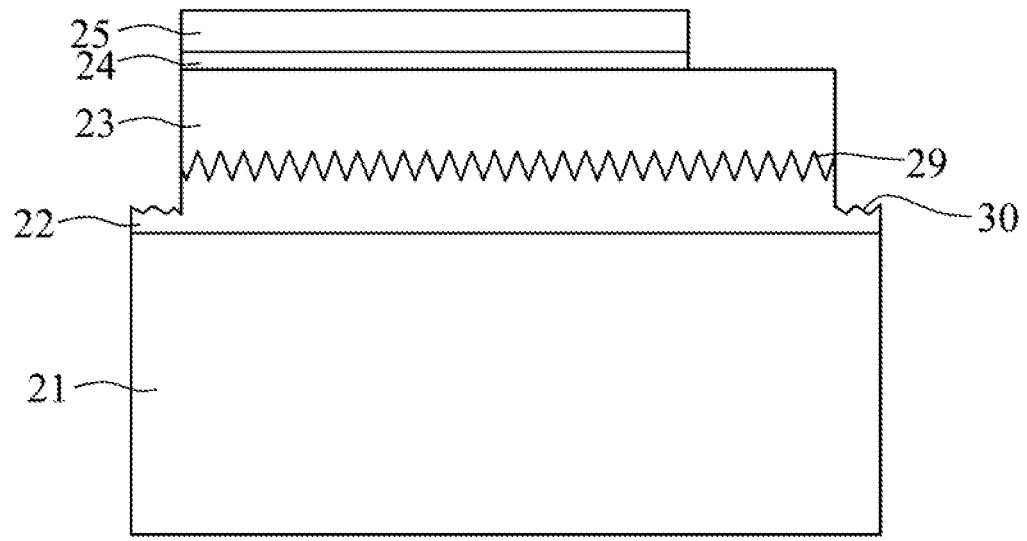
Figure 8:
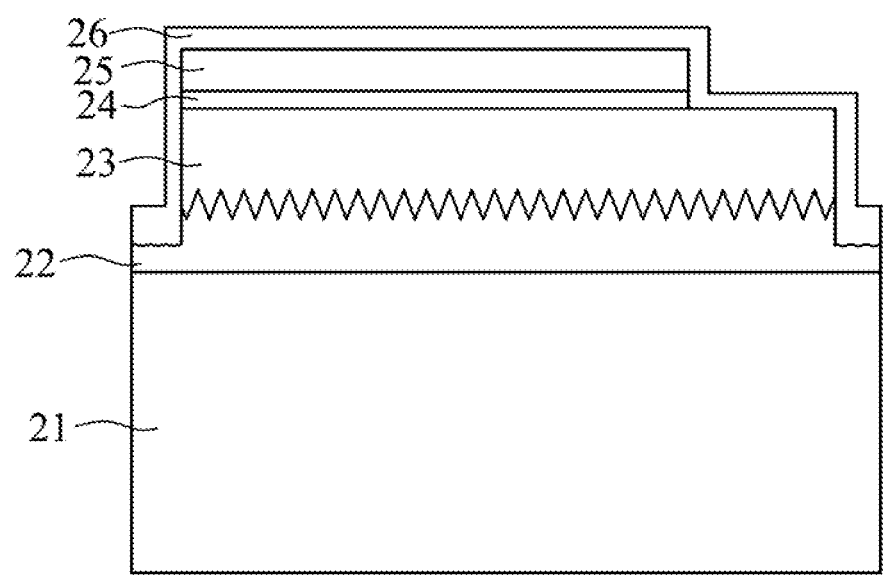
Figure 9:
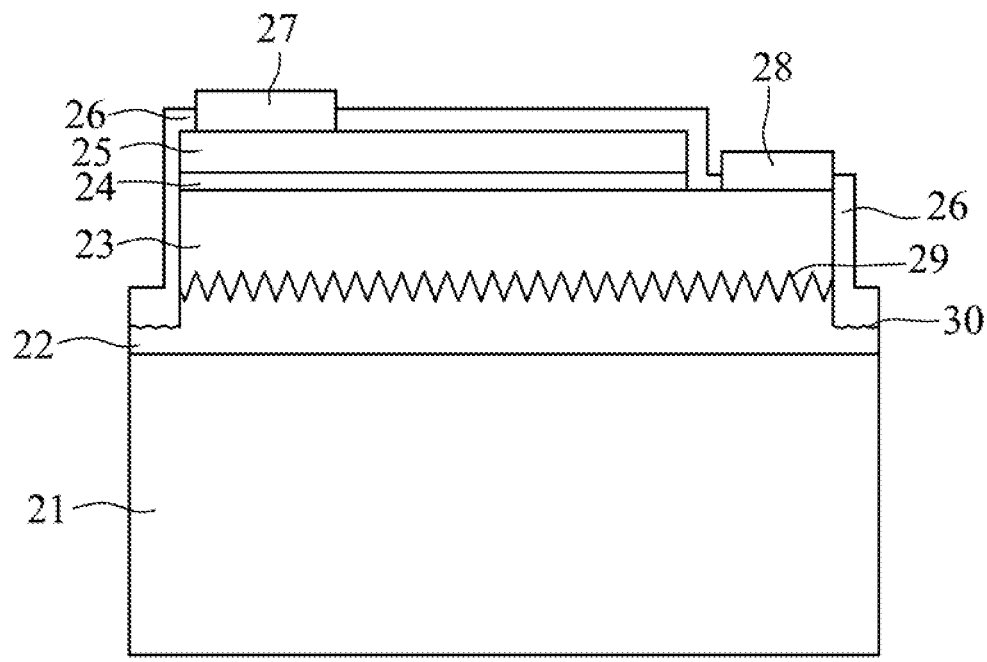

FIGS. 2 to 9 illustrate a first embodiment of a method for producing a flip-chip light emitting device according to the present disclosure. Thus, the flip-chip light emitting device produced by the first embodiment of the method as shown in FIG. 9 is a first embodiment of a flip-chip light emitting device according to the present disclosure.

The first embodiment of the method includes steps 1 to 8.

Figure 1:
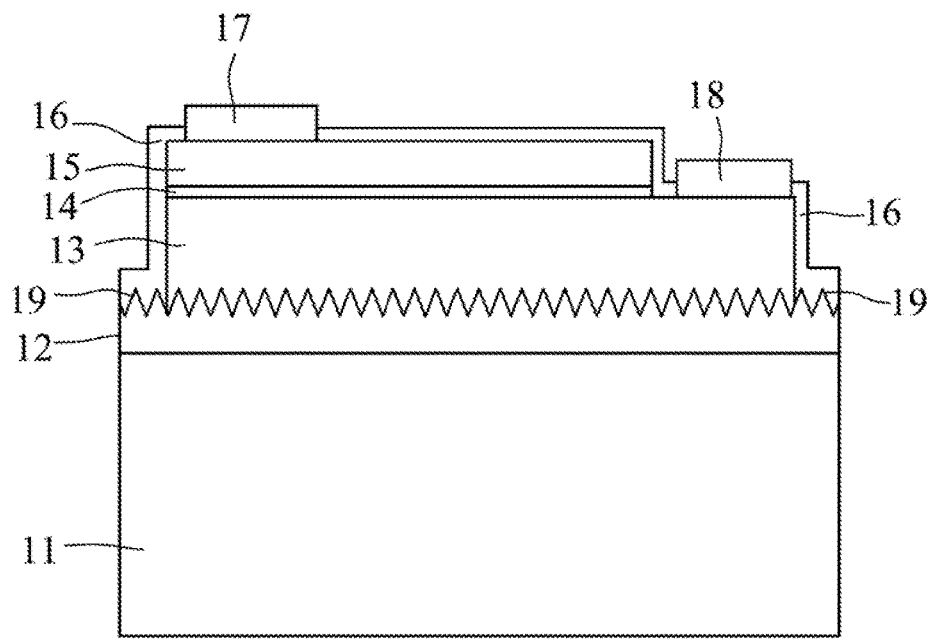
FIG. 1 is a schematic sectional view illustrating a conventional flip-chip light emitting device.
Figure 2:
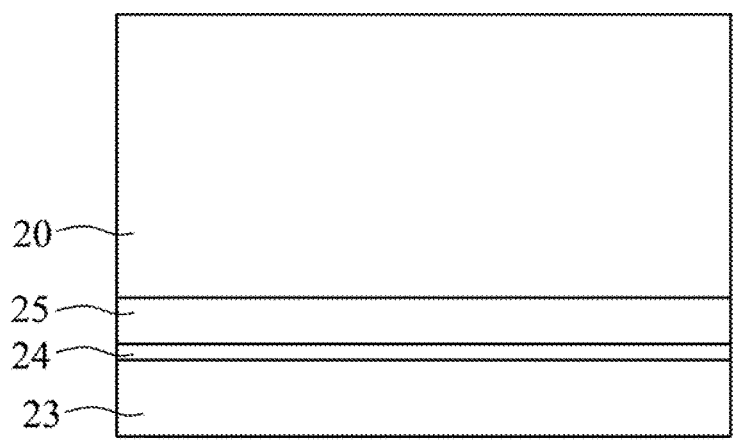
FIGS. 2 to 9 are schematic sectional views respectively illustrating steps 1 to 8 in a first embodiment of a method for producing a flip-chip light emitting device according to the present disclosure.

In step 1, referring to FIG. 2, a growth substrate 20 and an epitaxial light-emitting structure formed thereon are provided. The light-emitting structure includes a first-type electrically conductive layer 23, an active layer 24 that is disposed on the first-type electrically conductive layer 23 and that is composed of quantum wells, and an second-type electrically conductive layer 25 that is disposed on the active layer 24 opposite to the first-type electrically conductive layer 23. The light-emitting structure is formed on the growth substrate 20 in a manner that the second-type electrically conductive layer 25 is disposed between the growth substrate 20 and the active layer 24.

The term "first-type" refers to being doped with a first conductivity type dopant, and the term "second-type" refers to being doped with a second conductivity type dopant that is opposite in conductivity type to the first conductivity type dopant. For instance, the first conductivity type dopant may be a p-type dopant, and the second conductivity type dopant may be an n-type dopant, and vice versa.

The active layer 24 of the light-emitting structure may be made from a material selected from the group consisting of $Al_xIn_yGa_{(1-x-y)}P$ ($0\leq x\leq 1$, $0\leq y\leq 1$, $0\leq x+y\leq 1$), and $Al_xGa_{(1-x)}As$ ($0\leq x\leq 1$). The active layer 24 of the light-emitting structure may be configured to emit light having a wavelength ranging from 570 nm and 950 nm (such as yellow light, orange light, red light, and infrared light). For instance, the active layer 24 may emit red light having a wavelength ranging from 610 nm to 650 nm.

In other embodiments, an intermediate layer (not shown in the drawings) may be disposed between the growth substrate 20 and the epitaxial light-emitting structure. The intermediate layer may be selected from the group consisting of a buffer layer (which may be made from GaAs), an etch stop layer (which may be made from InGaP), and a combination thereof.

Figure 3:
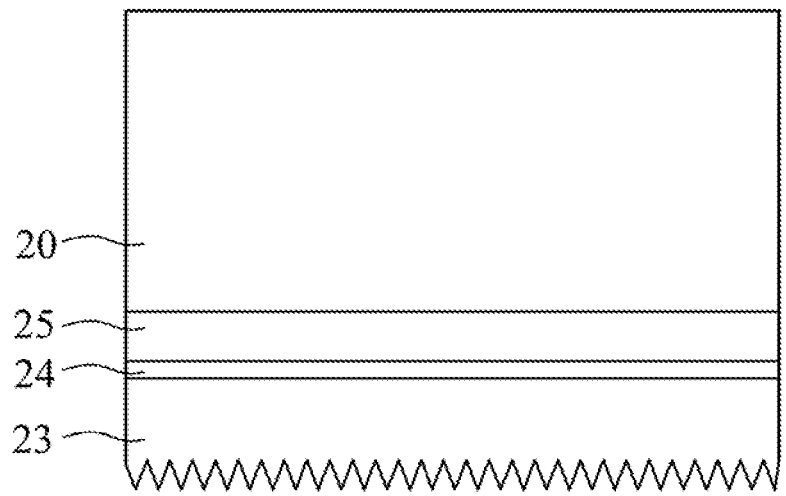

In step 2, referring to FIG. 3, a bottom surface of the first-type electrically conductive layer 23, which faces away from the growth substrate 20, and which is also a bottom surface of the light-emitting structure, is roughened (for example, through random roughening) to have a roughness (Ra) of 300 nm.

The light-emitting structure further has a top surface which is opposite to the roughened bottom surface of the light-emitting structure, and which is also a top surface of the second-type electrically conductive layer 25 facing toward the growth substrate 20, and side walls which interconnect the top and bottom surfaces of the light-emitting structure, and which are composed of side walls of the second-type electrically conductive layer 25, the active layer 24, and the first-type electrically conductive layer 23.

Figure 4:
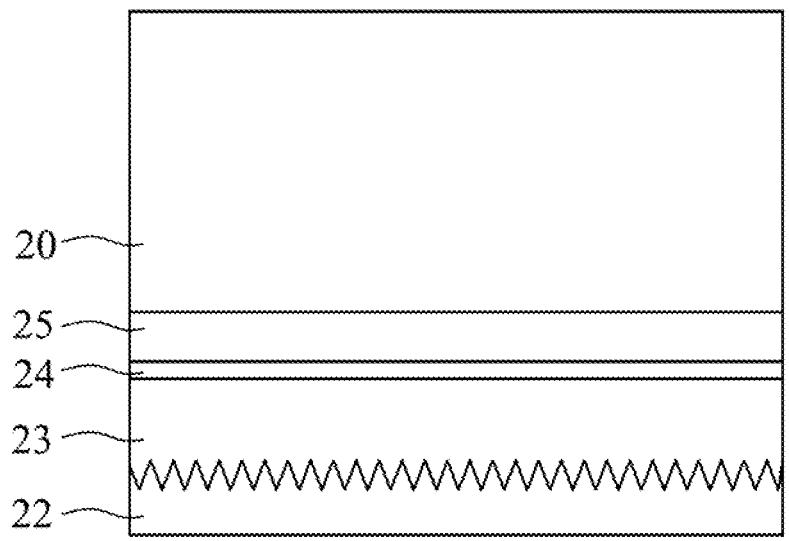

In step 3, referring to FIG. 4, a transparent bonding layer 22 is formed on the roughened bottom surface of the first-type electrically conductive layer 23 through deposition, and is subsequently subjected to polishing for facilitating connection of the transparent bonding layer 22 to a transparent substrate 21 as described below.

Figure 5:
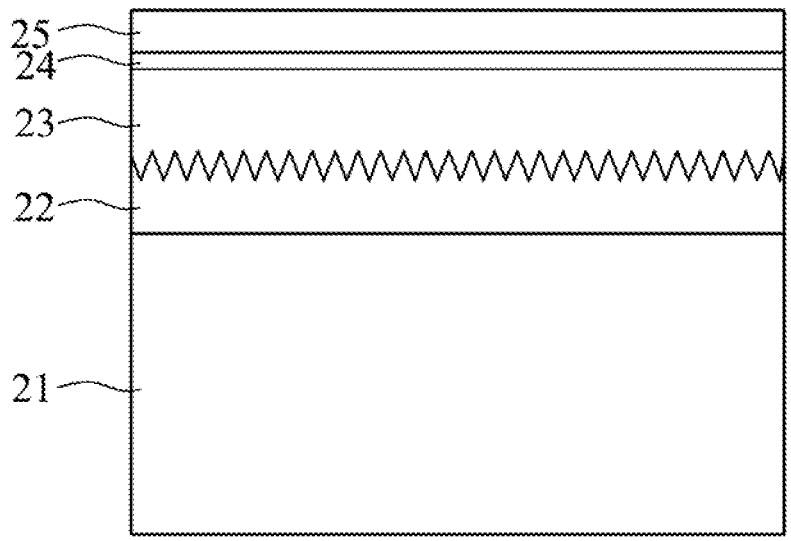

In step 4, referring to FIG. 5, the growth substrate 20 is removed (through, for example, grinding and etching) so as to expose the second-type electrically conductive layer 25 of the light-emitting structure, and the transparent substrate 21 is connected to the transparent bonding layer 22 (through, for example, high-temperature and high-pressure bonding), so that the transparent substrate 21 is disposed on the transparent bonding layer 22 opposite to the light-emitting structure (i.e. the light-emitting structure is connected with the transparent substrate 21 through the transparent bonding layer 22). In other embodiments, when the aforesaid intermediate layer is disposed between the growth substrate 20 and light-emitting structure, the aforesaid intermediate layer is removed with the growth substrate 20 in step 4.

In this embodiment, the transparent substrate 21 is made from sapphire and has a thickness of 90 μm, and the transparent bonding layer 22 is made from an insulation material. (e.g. silicon dioxide).

Light emitted from the light-emitting structure passes through the transparent bonding layer 22 and the transparent substrate 21, thereby being emitted out from the flip-chip light emitting device.

Figure 6:
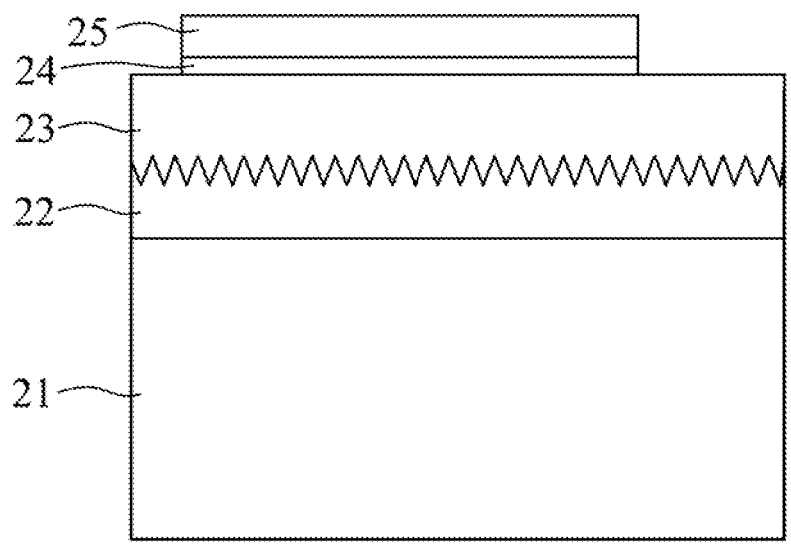

In step 5, referring to FIG. 6, through a photolithography process employing a photoresist, the second-type electrically conductive layer 25 and the active layer 24 are partially removed so as to partially expose the first-type electrically conductive layer 23.

In step 6, referring to FIG. 7, through a photolithography process employing a photoresist, a periphery of the first-type electrically conductive layer 23 is removed so as to expose a portion of the transparent bonding layer 22. Subsequently, via etching, the exposed portion of the transparent bonding layer 22 is subjected to thickness reduction, so that a first contact surface 30 of the transparent bonding layer 22 facing away from the transparent substrate 21 is formed and exposed.

The transparent bonding layer 22 further has a second contact surface 29 that faces away from the transparent substrate 21, and that meshes with and is bonded to the roughened bottom surface of the first-type electrically conductive layer 23. The first and second contact surfaces 30, 29 of the transparent bonding layer 22 are different in roughness and maximum height.

In this embodiment, the transparent bonding layer 22 further has smooth lateral walls that interconnect the first and second contact surfaces 30, 29.

The transparent bonding layer 22 may have a thickness ranging from 1 μm to 5 μm.

Figure 10:
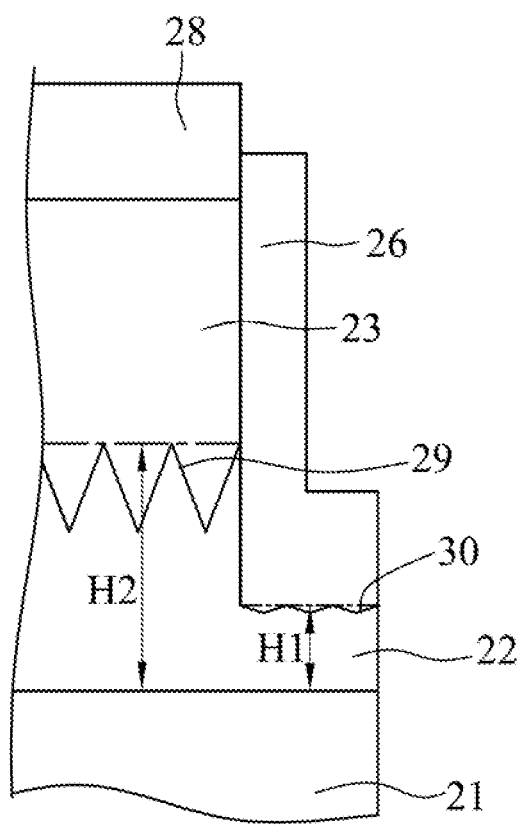
FIG. 10 is a fragmentary, enlarged sectional view illustrating first and second contact surfaces of a first embodiment of a flip-chip light emitting device produced by the first embodiment of the method.

In this embodiment, the first and second contact surfaces 30, 29 of the transparent bonding layer 22 respectively have first and second maximum heights (H1, H2) measured from the transparent substrate 21 (see FIG. 10).

Namely, a larger-thickness section of the transparent bonding layer 22, which is interposed between the first-type electrically conductive layer 23 and the transparent substrate 21, has the second contact surface 29 and hence a maximum thickness equal to the second maximum height (H2). Moreover, a smaller-thickness section of the transparent bonding layer 22, which extends from the larger-thickness section, has the first contact surface 30 and a maximum thickness equal to the first maximum height (H1).

In this embodiment, the first maximum height (H1) of the first contact surface 30 is lower than a second minimum height of the second contact surface 29 measured from the transparent substrate 21.

In this embodiment, the second maximum height (H2) of the second contact surface 29, i.e. the maximum thickness of the larger-thickness section of the transparent bonding layer 22, is 3 μm. The first maximum height (H1) of the first contact surface 30, i.e. the maximum thickness of the smaller-thickness section of the transparent bonding layer 22, is 2 μm. However, in another embodiment, the first maximum height (H1) of the first contact surface 30 may be lower than the second maximum height (H2) of the second contact surface 29 by at least 200 nm.

The first and second contact surfaces 30, 29 of the transparent bonding layer 22 respectively have first and second roughnesses (Ra). The first roughness of the first contact surface 30 is less than the second roughness of the second contact surface 29. The first roughness of the first contact surface 30 may be not greater than 50 nm, and the second roughness of the second contact surface 29 may be equal to or greater than 100 nm and not greater than 500 nm.

In this embodiment, the first roughness of the first contact surface 30 is 20 nm, and the second roughness of the second contact surface 29 is 300 nm.

The first contact surface 30 of the transparent bonding layer 22 may have a width ranging from 10 μm to 20 μm.

In step 7, referring to FIG. 8, via deposition, a protective insulating layer 26 is formed over the second-type electrically conductive layer 25 (over the top surface and the side walls thereof), over the active layer 24 (over the side walls thereof), over the first-type electrically conductive layer 23 (over a top surface and the side walls thereof), and over the transparent bonding layer 22 (over the first contact surface 30 and the smooth lateral walls thereof). Therefore, the protective insulating layer 26 hence has a roughened lower surface which faces toward the transparent substrate 21, and the first contact surface 30 of the transparent bonding layer 22 meshes with and is bonded to the roughened lower surface of the protective insulating layer 26. Accordingly, the protective insulating layer 26 sufficiently covers the light-emitting structure and can hence effectively protect the same. It should be noted that the protective insulating layer 26 may be partially or completely disposed over the first contact surface 30 of the bonding layer 22.

In step 8, referring to FIGS. 9 and 10, the protective insulating layer 26 is subjected to a hole-forming process, so that a first through hole is formed to partially expose the first-type electrically conductive layer 23, and so that a second through hole is formed to partially expose the second-type electrically conductive layer 25. Further, a first electrode 28 and a second electrode 27 are respectively disposed in the first and second through holes of the protective insulating layer 26 to be correspondingly electrically connected with the first-type electrically conductive layer 23 and the second-type electrically conductive layer 25. Accordingly, the flip-chip light emitting device is produced.

The flip-chip light emitting device thus produced may be configured to emit, through the transparent substrate 21, light such as red light or infrared light.

Since the first roughness of the first contact surface 30 of the transparent bonding layer 22 is lower than the second roughness of the second contact surface 29 of the transparent bonding layer 22, the number of interstices at the interface between the first contact surface 30 of the transparent bonding layer 22 and the protective insulating layer 26 can be greatly reduced. In addition, the vertical, smooth lateral walls of the transparent bonding layer 22 interconnecting the first and second contact surfaces 30, 29 of the transparent bonding layer 22 not only separate the first and second contact surfaces 30, 29, but also allow the protective insulating layer 26 to be well disposed thereover (i.e. no interstice is formed between the smooth lateral walls of the transparent bonding layer 22 and the protective insulating layer 26). In view of the foregoing, the protective insulating layer 26 can be prevented from cracking and undesired detachment attributed to interstices, thus effectively protecting the light-emitting structure.

In addition, the larger-thickness section of the transparent bonding layer 22 not only can provide sufficient bonding strength between the light-emitting structure and the transparent substrate 21, but also is sufficiently large in area to be polished for facilitating the connection of the transparent bonding layer 22 to the transparent substrate 21.

Figure 11:
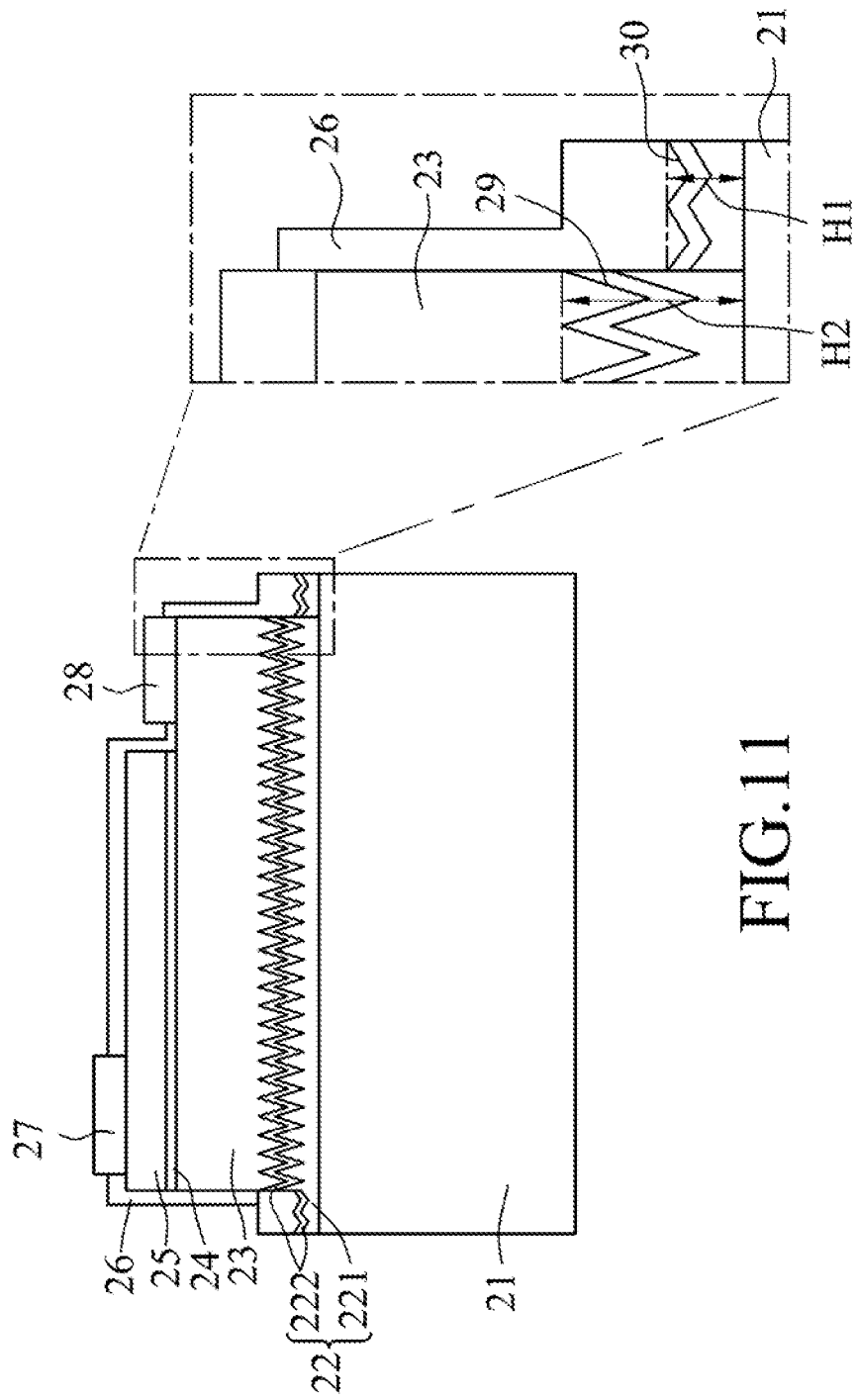
FIG. 11 is a schematic sectional view illustrating a second embodiment of the flip-chip light emitting device according to the present disclosure, a part of the second embodiment being enlarged in FIG. 11 to show first and second upper surfaces of a bonding layer of the flip-chip light emitting device.

Referring to FIG. 11, the present disclosure provides a second embodiment of the flip-chip light emitting device, which is similar to the first embodiment of the flip-chip light emitting device, except for following differences.

The substrate 21 in the second embodiment is not necessarily transparent.

The epitaxial light-emitting structure is an epitaxial light-emitting layer. Nevertheless, the epitaxial light-emitting layer in the second embodiment is structurally the same as the epitaxial light-emitting structure in the first embodiment.

The bonding layer 22 in the second embodiment is not necessarily transparent. Nevertheless, the bonding layer 22 may be made from a transparent insulation material.

The bonding layer 22 has an inner section that is bonded to the light-emitting layer, and an outer section that extends from the inner section and that is bonded to the protective insulating layer 26. The bonding layer 22 has a first bonding sub-layer 221 that is disposed on the substrate 21, and a second bonding sub-layer 222 that is disposed on the first bonding sub-layer 221 opposite to the substrate 21. The inner section has the first and second bonding sub-layers 221,222. The outer section has both of the first bonding sub-layer 221 and the second bonding sub-layer 222.

The outer section of the bonding layer 22 has a first upper surface 30 that faces away from the substrate 21 and that the protective insulating layer 26 is disposed thereon. The inner section of the bonding layer 22 has a second upper surface 29 that faces away from the substrate 21, and that the light-emitting layer is disposed thereon. The first and second upper surfaces 30, 29 respectively having the first and second roughnesses described above. The inner section of the bonding layer 22 has a thickness larger than that of the outer section of the bonding layer 22.

The first and second upper surfaces 30, 29 of the bonding layer 22 in the second embodiment are similar to the first and second contact surfaces 30, 29 of the transparent bonding layer 22 in the first embodiment, and respectively have the first and second maximum heights (H1, H2) described above.

The bonding layer 22 further has a lateral wall that interconnects the first and second upper surfaces 30, 29 of the bonding layer 22, and the light-emitting layer further has a side wall that interconnects the top and bottom surfaces of the light-emitting layer.

The protective insulating layer 26 is disposed over the top surface and the side wall of the light-emitting layer, and over the first upper surface 30 and the lateral wall of the bonding layer 22.

The lateral wall of the bonding layer 22 has a roughness smaller than that of the first upper surface 30 of the bonding layer 22.

The second bonding sub-layer 222 of the bonding layer 22 may be thinner than the first bonding sub-layer 221 of the bonding layer 22. A refractive index of the second bonding sub-layer 222 of the bonding layer 22 may be higher than a refractive index of the first bonding sub-layer 221 of the bonding layer 22. The refractive index of the second bonding sub-layer 222 of the bonding layer 22 is lower than a refractive index of the light-emitting layer, such that light emission, not light reflection, can be enhanced.

The second bonding sub-layer 222 of the bonding layer 22 has an inner segment disposed between the light-emitting layer and the first bonding sub-layer 221 of the bonding layer 22, and an outer segment disposed between the protective insulating layer 26 and the first bonding sub-layer 221 of the bonding layer 22. The inner segment of the second bonding sub-layer 222 having a thickness larger than that of the outer segment of the second bonding sub-layer 222.

The first bonding sub-layer 221 has an inner segment disposed between the substrate 21 and the inner segment of the second bonding sub-layer 222. The inner segment of the second bonding sub-layer 222 is smaller in thickness than the inner segment of the first bonding sub-layer 221.

The second bonding sub-layer 222 of the bonding layer 22 may be made from aluminum oxide, and the first bonding sub-layer 221 of the bonding layer 22 may be made from silicon oxide.

A thickness of the inner segment of the second bonding sub-layer 222 of the bonding layer 22 may be smaller than one fifth of a thickness of the inner segment of the first bonding sub-layer 221 of the bonding layer 22.

The inner segment of the second bonding sub-layer 222 of the bonding layer 22 may have a thickness ranging from 1 nm to 500 nm. The second bonding sub-layer 222 of the bonding layer 22 serves to enhance the adhesion of the first bonding sub-layer 221 of the bonding layer 22 to the light-emitting layer, such that the substrate 21 underneath the first bonding sub-layer 221 of the bonding layer 22 can be sufficiently connected with the light-emitting layer.

The inner segment of the first bonding sub-layer 221 of the bonding layer 22 may have a thickness greater than 1 µm, for instance, a thickness greater than 2 µm, but may not be greater than 5 um.

Figure 12:
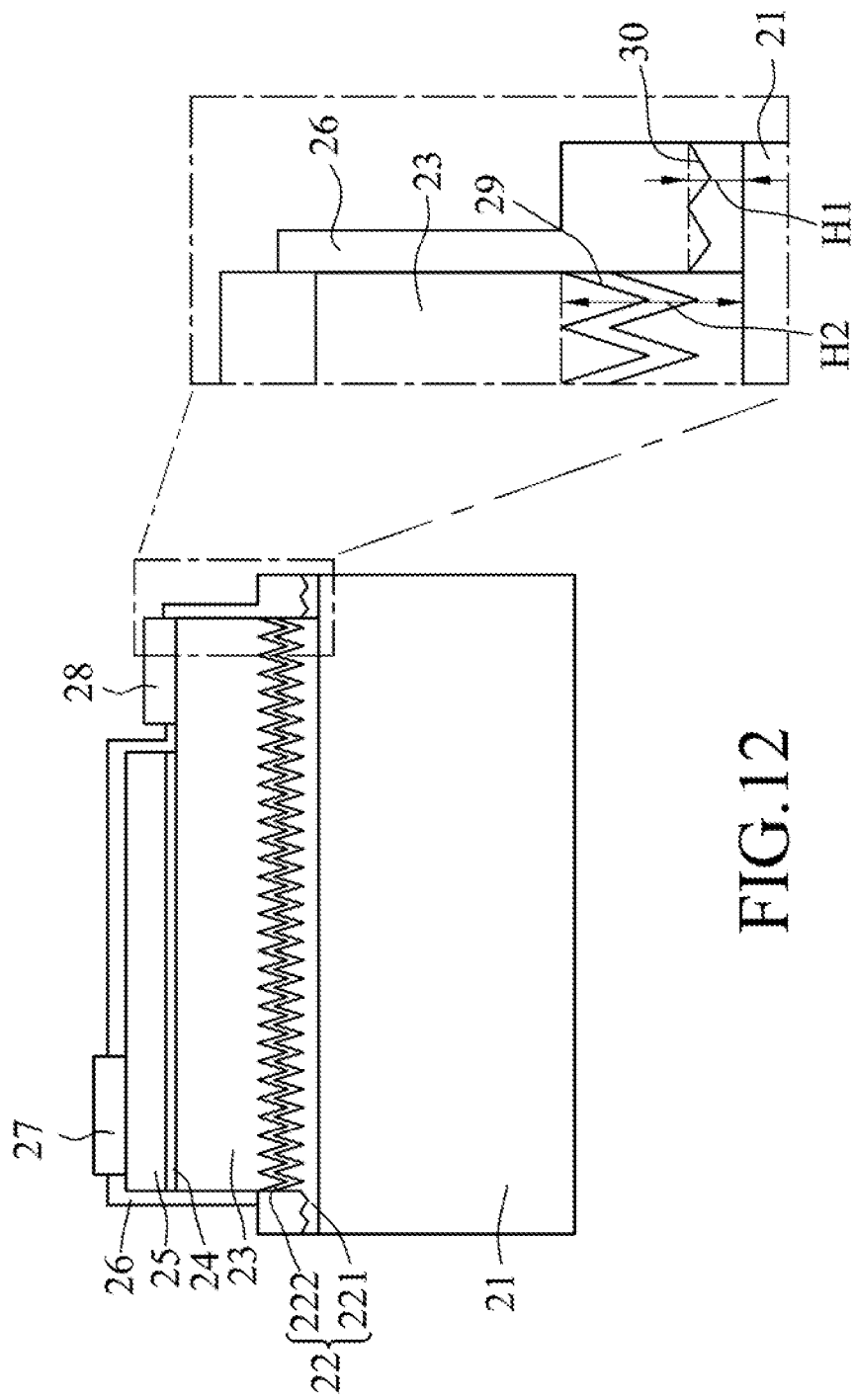
FIG. 12 is a schematic sectional view illustrating a third embodiment of the flip-chip light emitting device according to the present disclosure, a part of the third embodiment being enlarged in FIG. 12 to show the first and second upper surfaces of the bonding layer of the flip-chip light emitting device.

Referring to FIG. 12, the present disclosure provides a third embodiment of the flip-chip light emitting device, which is similar to the second embodiment of the flip-chip light emitting device, except for the following difference.

The outer section of the bonding layer 22 has only the first bonding sub-layer 221. The first bonding sub-layer 221 of the bonding layer 22 has the first upper surface 30 of the bonding layer 22, and contacts the protective insulating layer 26.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A flip-chip light emitting device comprising:
   a substrate;
   an epitaxial light-emitting layer having a top surface and a bottom surface that is opposite to said top surface and faces toward said substrate;
   a bonding layer disposed between said substrate and said light-emitting layer; and
   a protective insulating layer disposed over said light-emitting layer and said bonding layer,
   wherein said bonding layer has an outer section, an inner section surrounded by said outer section, a first upper surface that is formed on said outer section, that faces away from said substrate, and that is bonded to said protective insulating layer, and a second upper surface that is formed on said inner section, that faces away from said substrate, and that is bonded to said light-emitting layer, said first and second upper surfaces respectively having first and second roughnesses, said first roughness of said first upper surface being smaller than said second roughness of said second upper surface, a height of said first upper surface from said substrate being lower than a height of said second upper surface from said substrate, and wherein:
   said light-emitting layer further has a side wall that interconnects said top surface and said bottom surface of said light-emitting layer;
   said bonding layer further has a lateral wall that extends downwardly from said second upper surface to said first upper surface of said bonding layer, that extends around said inner section of said bonding layer, and that isolates said inner section of said bonding layer from said outer section of said bonding layer, said second upper surface being entirely higher than said first upper surface, said lateral wall of said bonding layer being flush with said side wall of said light-emitting layer; and
   said protective insulating layer is disposed over said top surface and said side wall of said light-emitting layer, and over said first upper surface and said lateral wall of said bonding layer.

2. The flip-chip light emitting device as claimed in claim 1, wherein said bonding layer has a first bonding sub-layer that is disposed on said substrate, and a second bonding sub-layer that is disposed on said first bonding sub-layer opposite to said substrate.

3. The flip-chip light emitting device as claimed in claim 2, wherein said inner section having said first and second bonding sub-layers, said outer section of said bonding layer has only said first bonding sub-layer.

4. The flip-chip light emitting device as claimed in claim 2, wherein said inner section having said first and second bonding sub-layers, said outer section of said bonding layer has both of said first bonding sub-layer and said second bonding sub-layer.

5. The flip-chip light emitting device as claimed in claim 1, wherein said lateral wall of said bonding layer has a roughness smaller than that of said first upper surface of said bonding layer.

6. The flip-chip light emitting device as claimed in claim 2, wherein said second bonding sub-layer of said bonding layer is thinner than said first bonding sub-layer of said bonding layer.

7. The flip-chip light emitting device as claimed in claim 2, wherein a refractive index of said second bonding sub-layer of said bonding layer is higher than a refractive index of said first bonding sub-layer of said bonding layer.

8. The flip-chip light emitting device as claimed in claim 4, wherein said second bonding sub-layer of said bonding layer has an inner segment disposed between said light-emitting layer and said first bonding sub-layer of said bonding layer, and an outer segment disposed between said protective insulating layer and said first bonding sub-layer of said bonding layer, said inner segment of said second bonding sub-layer having a thickness larger than that of said outer segment of said second bonding sub-layer.

9. The flip-chip light emitting device as claimed in claim 8, wherein said first bonding sub-layer has an inner segment disposed between said substrate and said inner segment of said second bonding sub-layer, said inner segment of said second bonding sub-layer is smaller in thickness than said inner segment of said first bonding sub-layer.

10. The flip-chip light emitting device as claimed in claim 2, wherein said first bonding sub-layer of said bonding layer has said first upper surface of said bonding layer, and contacts said protective insulating layer.

11. The flip-chip light emitting device as claimed in claim 3, wherein said second bonding sub-layer of said bonding layer has said first upper surface of said bonding layer, and contacts said protective insulating layer.

12. The flip-chip light emitting device as claimed in claim 2, wherein said second bonding sub-layer of said bonding layer is made from aluminum oxide.

13. The flip-chip light emitting device as claimed in claim 2, wherein said first bonding sub-layer of said bonding layer is made from silicon oxide.

14. The flip-chip light emitting device as claimed in claim 1, wherein said bonding layer has a thickness ranging from 1 μm to 5 μm.

15. The flip-chip light emitting device as claimed in claim 1, wherein said bonding layer is made from a transparent insulation material.

16. The flip-chip light emitting device as claimed in claim 1, which is configured to emit light selected from the group consisting of red light and infrared light.

17. The flip-chip light emitting device as claimed in claim 8, wherein a thickness of said inner segment of said second bonding sub-layer of said bonding layer is smaller than one fifth of a thickness of said inner segment of said first bonding sub-layer of said bonding layer.

* * * * *